(12) United States Patent
Castro

(10) Patent No.: US 11,552,005 B2
(45) Date of Patent: Jan. 10, 2023

(54) INTEGRATED CIRCUIT PACKAGE ELECTRONIC DEVICE

(71) Applicant: Texas Instruments Incorporated, Dallas, TX (US)

(72) Inventor: Abram M. Castro, Fort Worth, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/399,010

(22) Filed: Aug. 10, 2021

(65) Prior Publication Data

US 2021/0366811 A1    Nov. 25, 2021

Related U.S. Application Data

(63) Continuation of application No. 16/031,695, filed on Jul. 10, 2018, now Pat. No. 11,088,052.

(51) Int. Cl.

| | |
|---|---|
| *H01L 21/48* | (2006.01) |
| *H01L 21/56* | (2006.01) |
| *H01L 23/495* | (2006.01) |
| *H01L 23/31* | (2006.01) |
| *H01L 23/00* | (2006.01) |

(52) U.S. Cl.
CPC .... *H01L 23/49524* (2013.01); *H01L 21/4825* (2013.01); *H01L 21/561* (2013.01); *H01L 21/563* (2013.01); *H01L 21/566* (2013.01); *H01L 21/568* (2013.01); *H01L 23/3185* (2013.01); *H01L 23/49541* (2013.01); *H01L 23/49568* (2013.01); *H01L 24/14* (2013.01); *H01L 24/96* (2013.01); *H01L 2224/14131* (2013.01)

(58) Field of Classification Search
CPC ......... H01L 2224/14131; H01L 21/568; H01L 23/3185; H01L 23/49541; H01L 23/49568; H01L 24/14; H01L 24/96; H01L 21/566; H01L 21/4825; H01L 21/561; H01L 21/563; H01L 23/49524
USPC ......................................... 257/666; 438/123
See application file for complete search history.

(56) References Cited

U.S. PATENT DOCUMENTS

| | | |
|---|---|---|
| 6,294,744 B1 | 9/2001 | Kinoshita |
| 9,859,256 B1 | 1/2018 | Ziglioli |
| 2002/0135429 A1 | 9/2002 | Akagawa et al. |
| 2005/0142033 A1 | 6/2005 | Glezer et al. |
| 2011/0193105 A1* | 8/2011 | Lerman ............... H01L 25/0753 257/E33.061 |

(Continued)

*Primary Examiner* — Didarul A Mazumder
(74) *Attorney, Agent, or Firm* — Dawn Jos; Frank D. Cimino

(57) ABSTRACT

A surface mount electronic device providing an electrical connection between an integrated circuit (IC) and a printed circuit board (PCB) is provided and includes a die and a dielectric material formed to cover portions of the die. Pillar contacts are electrically coupled to electronic components in the die and the pillar contacts extend from the die beyond an outer surface of the die. A conductive ink is printed on portions of a contact surface of the electronic device package and forms electrical terminations on portions of the dielectric material and electrical connector elements that connect an exposed end surface of the pillar contacts to the electrical terminations.

15 Claims, 11 Drawing Sheets

(56) References Cited

U.S. PATENT DOCUMENTS

| | | | |
|---|---|---|---|
| 2015/0091187 A1* | 4/2015 | Reber | .................... H01L 24/16 |
| | | | 438/109 |
| 2015/0262931 A1* | 9/2015 | Vincent | .................. H01L 24/96 |
| | | | 257/773 |
| 2015/0348865 A1 | 12/2015 | Vincent et al. | |
| 2017/0005067 A1 | 1/2017 | Yang et al. | |
| 2018/0301420 A1 | 10/2018 | Kim et al. | |
| 2019/0157233 A1 | 5/2019 | Fillion et al. | |

\* cited by examiner

INTEGRATED CIRCUIT PACKAGE ELECTRONIC DEVICE

This application is a continuation of U.S. patent application Ser. No. 16/031,695, filed Jul. 10, 2018, the contents of which are herein incorporated by reference in its entirety.

TECHNICAL FIELD

This relates to integrated circuit package technology for semiconductor devices.

BACKGROUND

Quad flat no-lead (QFN) packages are an integrated circuit (IC) package technology that provide an electrical connection between the integrated circuit and a printed circuit board (PCB). QFN packages require a die (e.g., silicon die) and a lead-frame to house electrical terminations that connect to the PCB. In addition, electrically conductive connecting wires are required to provide an electrical connection from the die to the lead frame. The lead frame carries signals from the die outside the QFN package to the printed circuit board. The lead frame includes a thermal pad (die attach pad) that facilitates the dissipation of heat.

Fan-out wafer chip scale packages (FOWCSP) are another IC package technology that provide an electrical connection between an IC and a printed circuit board. The process to make FOWCSP's requires over-molding dies with an epoxy-molding compound. Electrical interconnects are accessed on the dies via a mechanical process and redistribution layers are then applied to the dies to form the fan out terminations, which extend beyond the perimeter of the dies. Fan-out technology, however, utilize a wafer process that limits cost capability.

SUMMARY

In described examples, a method includes placing a die in a carrier where the die has pillar contacts electrically coupled to components in the die and where the pillar contacts extend beyond an outer surface of the die. A dielectric material covers portions of the die and between the pillar contacts to form an electronic device package. An exposed surface of the pillar contacts is polished to ensure that the pillar contacts are coplanar with the dielectric material and to form contact surface of the electronic device package that includes exposed pillar contact ends. A conductive ink is printed on portions of the contact surface of the electronic device package to form electrical connector elements that connect to the exposed pillar contact ends.

In another example, a method includes forming pillar contacts in a wafer where the pillar contacts are electrically coupled to components in the wafer and where the pillar contacts extend beyond an outer surface of the wafer. The wafer is diced into dies and a dielectric material is formed to cover portions of the dies and between the pillar contacts. The formation of the dielectric material covering portions of the dies forms an array comprised of electronic device packages. A contact surface of the array is polished where the array has exposed contact ends that are coplanar with the dielectric material. A conductive ink is printed on portions of the contact surface of the array to form electrical terminations and electrical conductor elements where the electrical conductor elements electrically connecting the exposed contact ends to the electrical terminations.

In yet another example, an electronic device includes a die and pillar contacts electrically coupled to electronic components in the die where the pillar contacts extending from the die beyond an outer surface of the die. A dielectric material covers portions of the die and between the pillar contacts. The die and the dielectric material forming an electronic device package. Electrical terminations and electrical connector elements are printed with a printable conductive ink on portions of the contact surface of the electronic device package where the electrical connector elements connect an exposed surface of the pillar contacts to the electrical terminations.

DETAILED DESCRIPTION

Disclosed herein is an integrated circuit (IC) package electronic device that provides an electrical connection between an integrated circuit (IC) and a printed circuit board (PCB). More specifically, disclosed herein is a PCB surface mount electronic device that is a hybrid between a fan-out wafer chip scale package (FOWCSP) and a quad flat no-lead (QFN) package. The hybrid QFN concept combines processes (e.g., bumping, mass carriers (e.g., panel carriers), printing, etc.) with a flow process to produce the hybrid QFN package without the need for connecting wires or a lead-frame found in standard QFN packages, which reduces manufacturing costs, while simultaneously increasing performance and improving thermal dissipation. More precisely, the hybrid FOWCSP/QFN concept replaces connecting wires with a bump process to create pillar contacts and eliminates the need for a lead-frame with the incorporation of a dry-compressed dielectric material and a conductive ink printing process.

More specifically, the hybrid QFN includes pillar contacts having a first end electrically coupled to components in a die and a second end that extends beyond an outer surface of the die. A dielectric material formed, for example via a dry compression process, around the die and pillar contacts isolates the pillar contacts from each other, but leaves a surface of the second end exposed. The printing process prints an electrically conductive ink on a contact surface of the hybrid QFN package to provide electrically conductive paths from the IC to the PCB via the pillar contacts. The resulting hybrid QFN package can have a low-profile height of less than 250 microns.

Figure 1A:
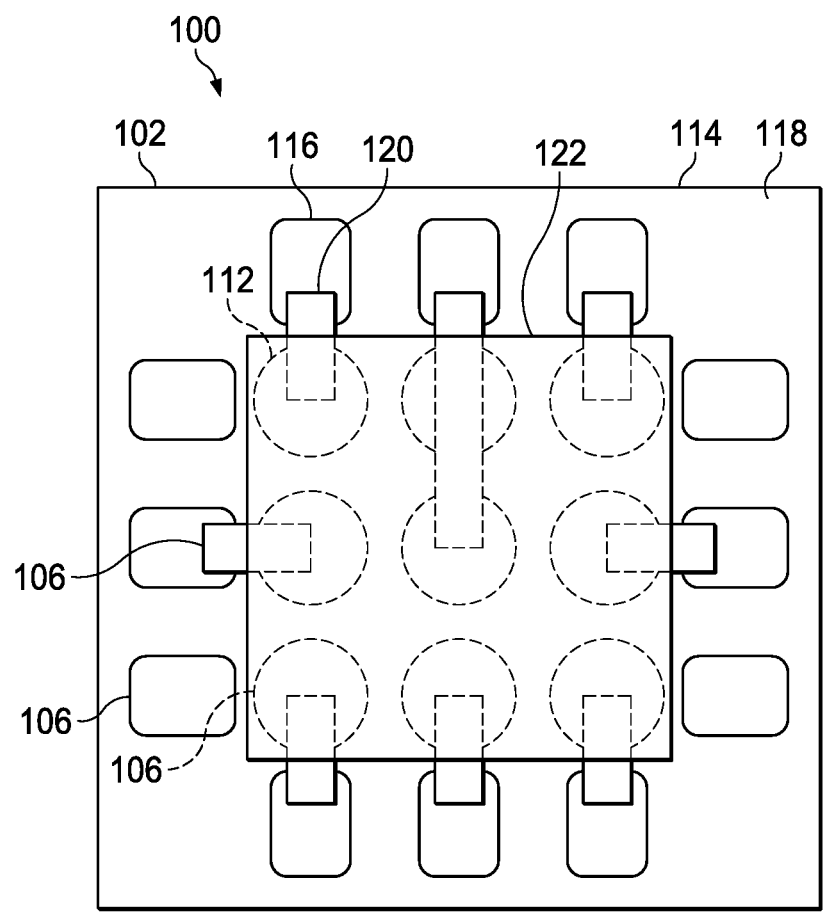
FIG. 1A is a contact surface view of an example hybrid quad flat no-lead (QFN) package.
Figure 1B:
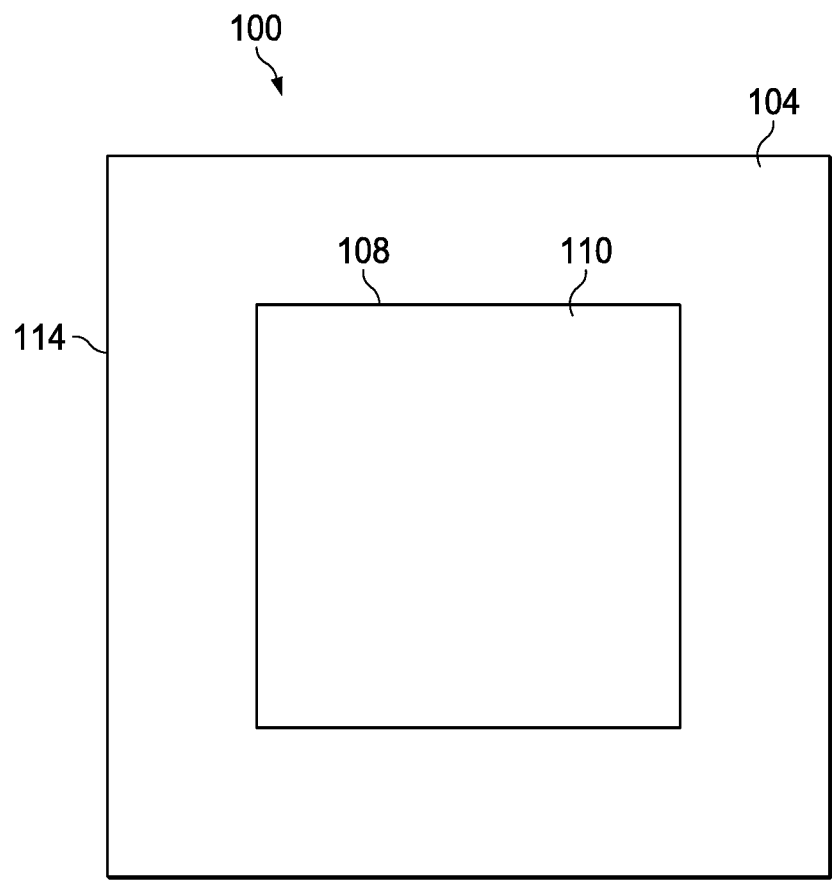
FIG. 1B is a non-contact surface view of the example hybrid QFN package.
Figure 1C:
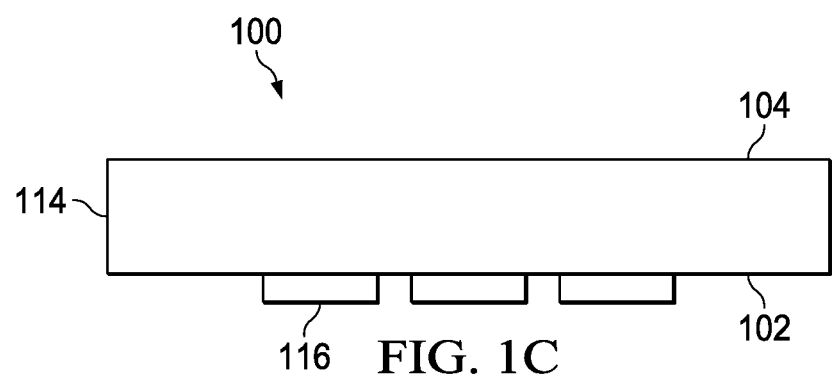
FIG. 1C is an elevation view of the example hybrid QFN package.
Figure 2:
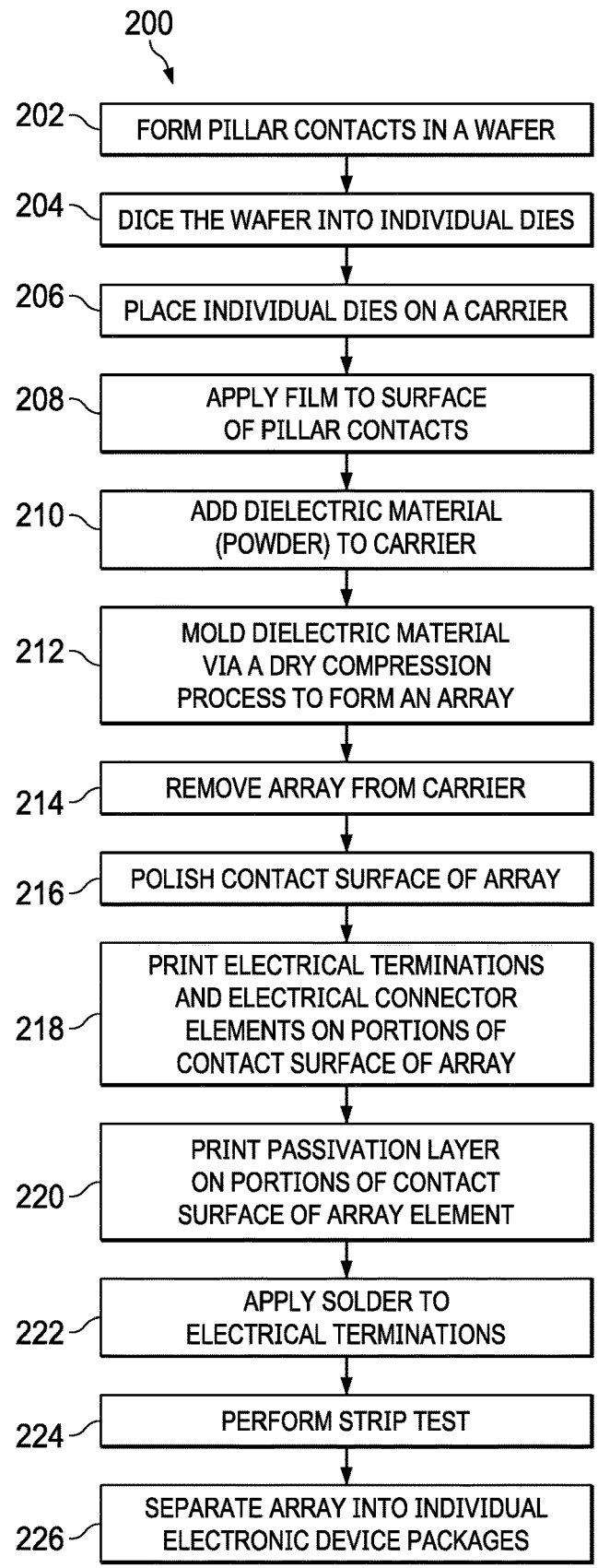
FIG. 2 is a flow diagram of an example process to manufacture the hybrid QFN package.

FIGS. 1A-1C represent a contact surface view, a- non-contact surface view, and an elevation view respectively of an example hybrid quad flat no-lead (QFN) package (hereinafter "hybrid QFN package") 100. The contact surface view is a view of a contact surface 102 of the hybrid QFN package 100 and the non-contact surface view is a view of a non-contact surface 104 of the hybrid QFN package 100. As will be described further below, the contact surface 102 includes exposed electrical connections (e.g., contacts), electrical terminations, and/or electrical pathways 106 that provide electrically conductive connections and/or pathways from the IC to the PCB. Thus, the contact surface 102 is the surface of the hybrid QFN package 100 that faces (or interfaces with) the PCB when the hybrid QFN package 100 is mounted to the PCB. Accordingly, the non-contact surface 104 is the surface of the hybrid QFN package 100 that faces away from the PCB when the hybrid QFN package 100 is mounted to the PCB.

The hybrid QFN package 100 includes a die 108 made from a semi-conductive material (e.g., silicon, gallium arsenide, etc.). The die 108 can include electronic components embedded therein thus, forming the IC. As illustrated in FIG. 1B, a surface 110 of the die 108 is exposed to ambient air on the non-contact surface 104 of the hybrid QFN package 100. The exposure of the die 108 to ambient airflow facilitates the dissipation of heat from the hybrid QFN package 100. Standard QFN's, on the other hand, require a thermal pad (die attach pad) to transfer heat away from the QFN package. The exposure of the die 108 in the hybrid QFN package 100 facilitates the dissipation of heat and thus, the thermal pad is optional when mounting the hybrid QFN package 100 to the PCB.

The hybrid QFN package 100 further includes pillar contacts 112 that provide an electrical pathway from the electronic components embedded in the die 108 to the contact surface 102 of the hybrid QFN package 100. The pillar contacts 112 are situated inside the die 108 such that a first end of the pillar contacts 112 are in electrical contact with the electronic components embedded in the die 108, as will be explained further below. The pillar contacts 112 extend from inside the die 108 beyond an outer surface of the die 108 and are substantially flush or coplanar with the contact surface 102 of the hybrid QFN package 100. Thus, the pillar contacts 112 are exposed on the contact surface 102. The pillar contacts 112, including solder disposed on the exposed surface can have a height in the range of approximately 35-70 microns The height, however, can be modified outside this range for reliability purposes.

The hybrid QFN package 100 further includes a dielectric material 114 that frames in the die 108 and the pillar contacts 112. Specifically, the dielectric material 114 covers, via a dry compression process described below, portions of the die 108 and between the pillar contacts 112 such that the pillar contacts 112 are isolated from each other. A surface of the pillar contacts 112 remains exposed on the contact surface 102 of the hybrid QFN package to provide an electrical connection to the PCB. The dielectric material 114 covers portions of the die 108 such that, as mentioned above, the surface 110 of the die 108 on the non-contact surface 104 of the hybrid QFN package 100 remains exposed to ambient air to facilitate heat dissipation.

A print process (e.g., high-speed, 3-D, screen, inkjet, etc.) prints a printable conductive ink on portions of the contact surface 102 of the hybrid QFN package 100 to form the electrical connections, terminations and/or pathways 106. Specifically, the print process prints electrical terminations 116 on portions of a surface 118 of the dielectric material 114. The electrical terminations 116 provide electrical connections from the hybrid QFN package 100 to the PCB. Thus, the printable conductive ink replaces the need for the lead-frame in the standard QFN packages. In addition, the print process prints electrical connector elements 120 on portions of the contact surface 102 of the hybrid QFN package 100 from one or more pillar contacts 112 to the electrical terminations 116. Thus, the printable conductive ink completes the electrical pathway from the IC to the PCB. The print process is able to "fan out" the electrical terminations to a desired pitch in order to facilitate PCB board mounting.

In addition, the print process prints a passivation layer 122 on portions of the contact surface 102 of the hybrid QFN package 100. Specifically, the print process prints the passivation layer 122 over the pillar contacts 112 to protect against corrosion. The electrical terminations 116, however, remain exposed for connection to the PCB. A finishing conductive material (e.g., solder) can be applied to the electrical terminations 116 as a final finishing process.

Figure 3:
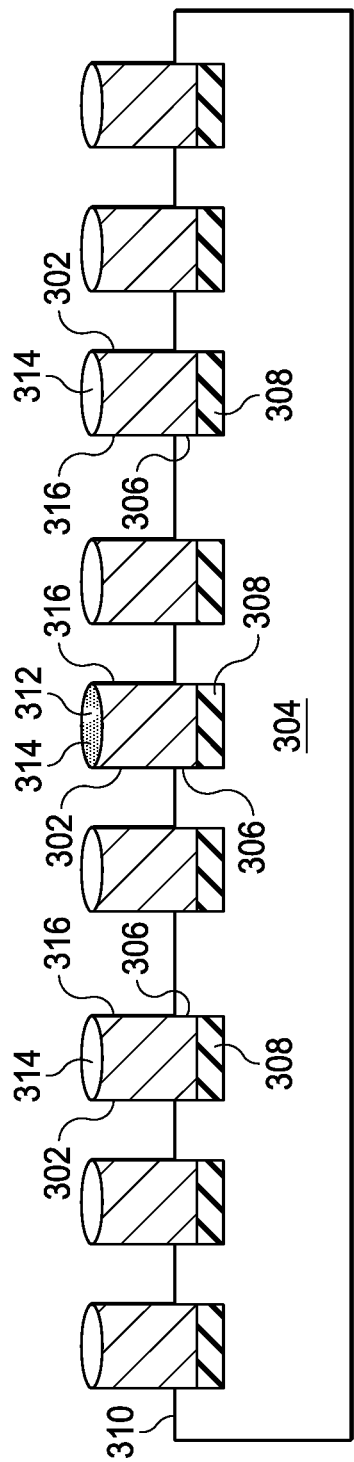
FIGS. 3-16 illustrate a sequence of the process to manufacture the hybrid QFN package corresponding the flow diagram illustrated in FIG. 2.

Referring to FIGS. 2-16, FIG. 2 is a flow diagram 200 and FIGS. 3-16 illustrate a sequence of an example process to manufacture the hybrid QFN package 100 described above and illustrated in FIGS. 1A-1C. At 202, pillar contacts 302 are formed in and on a semi-conductive wafer (hereinafter "wafer") 304 (e.g., silicon, gallium-arsenide, etc.) via a bumping process, see FIG. 3. Specifically, the pillar contacts 302 are formed such that a first end 306 of the pillar contacts 302 extends into the wafer 304 and makes an electrical connection with an electronic component 308 embedded inside the wafer 304. The pillar contacts 302 extend from inside the wafer 304 beyond an active (first) surface 310 of the wafer 304. An interconnecting conductive material (e.g., solder) 312 can be disposed on a surface 314 of a second end 316 of the pillar contacts 302 thus, forming mechanical interconnects to other electrical connections, see FIG. 3.

Figure 4:
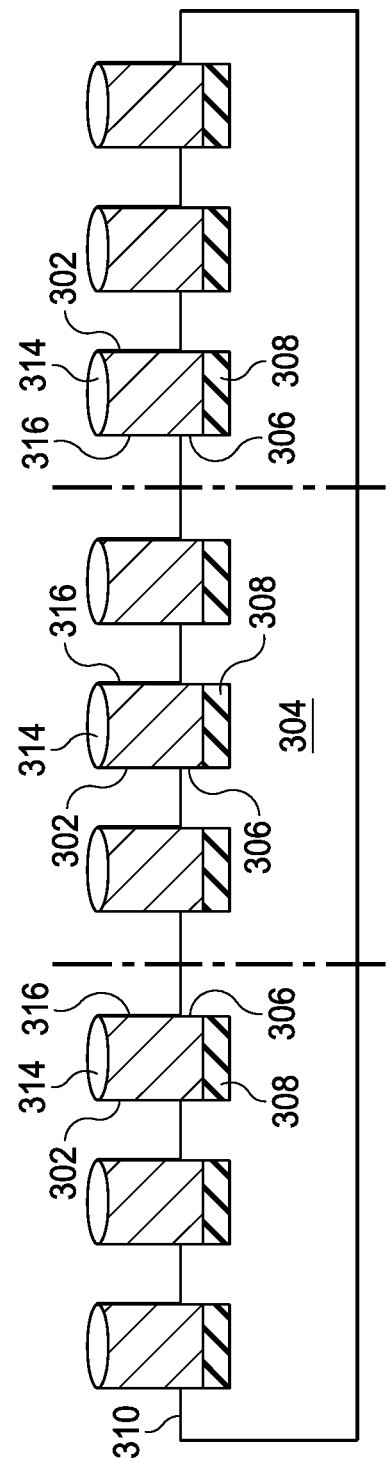
Figure 5:
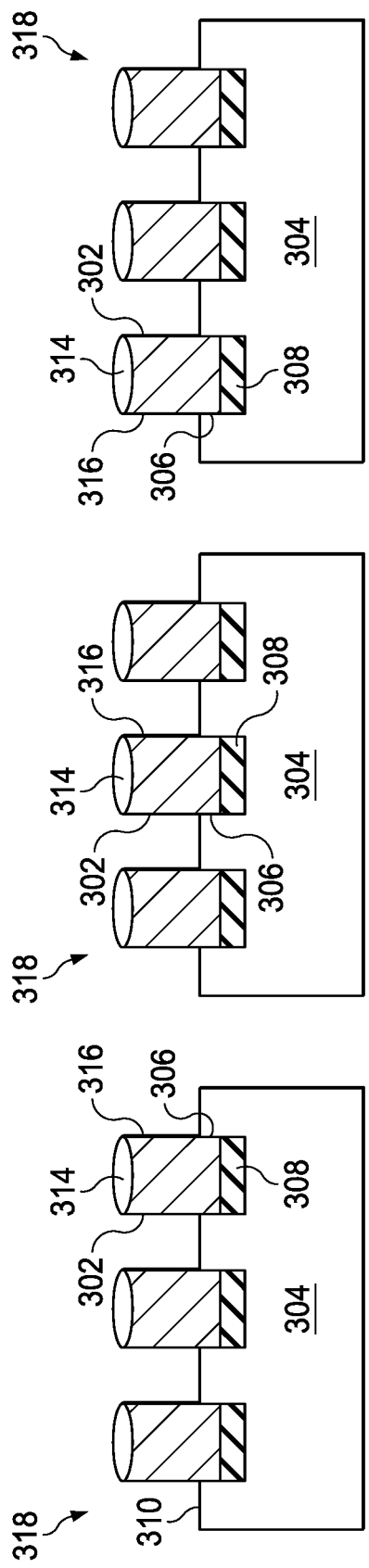
Figure 6:
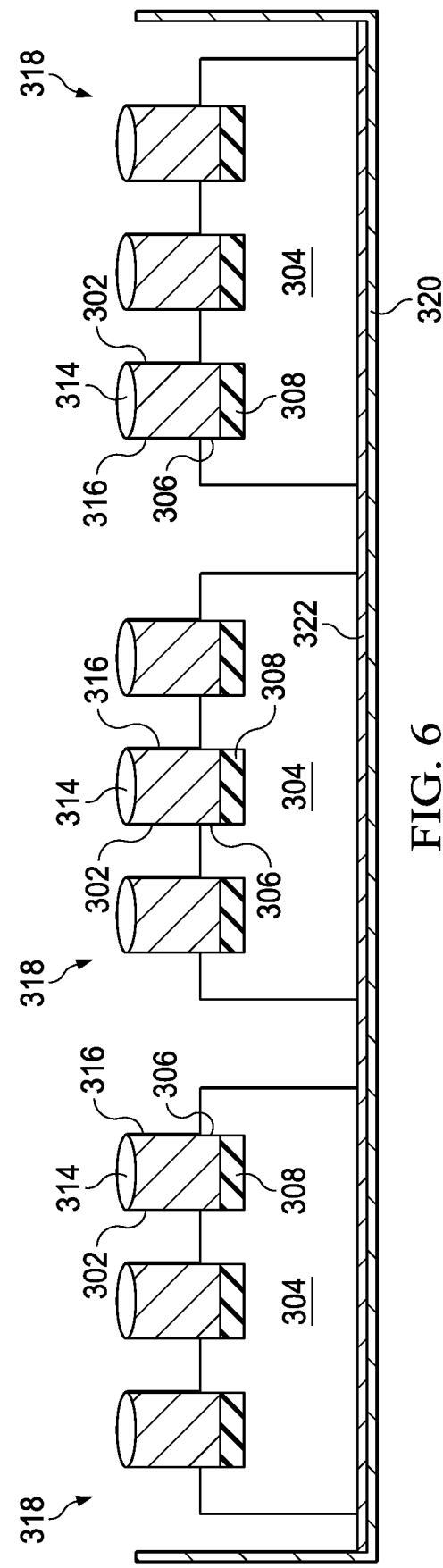
Figure 7:
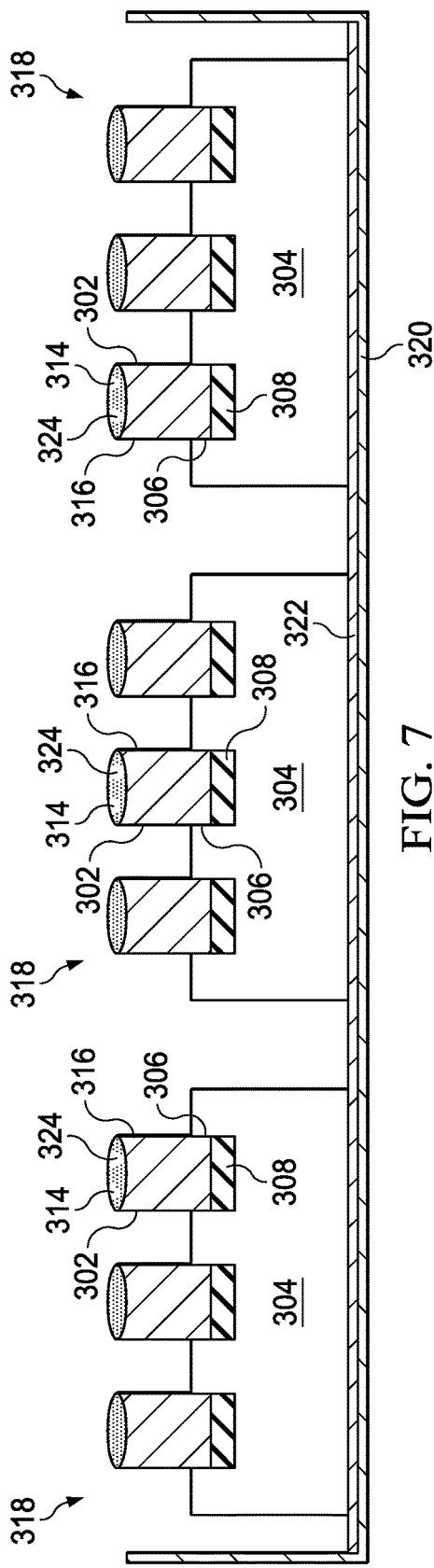
Figure 8:
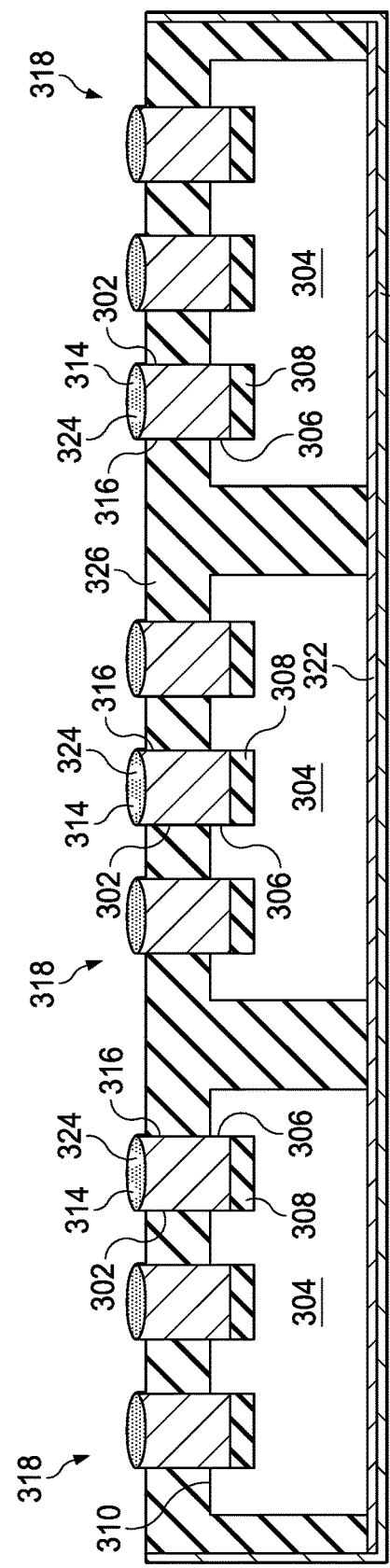
Figure 9:
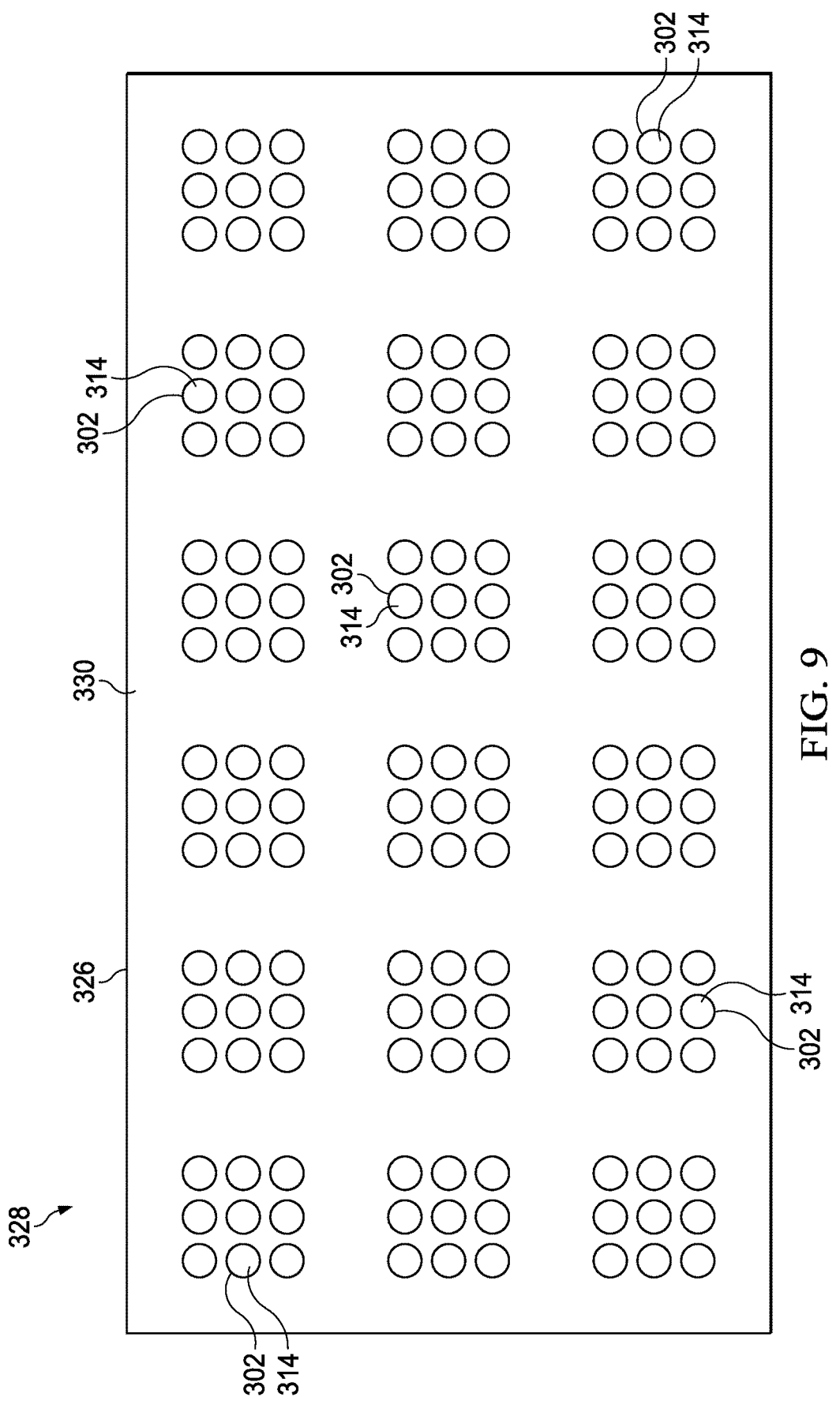
Figure 10:
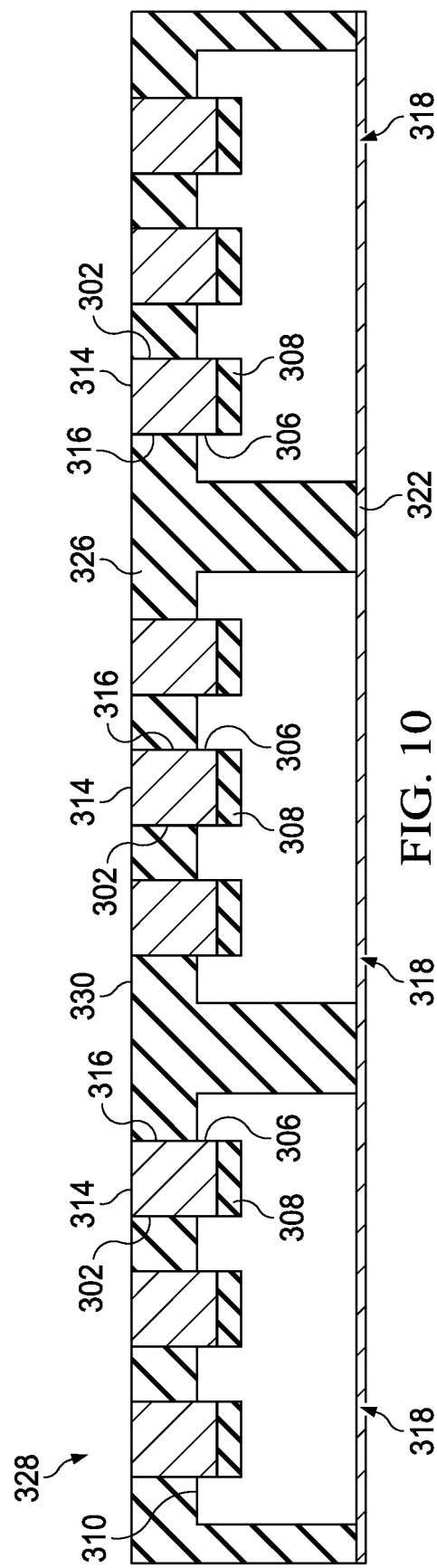

At 204, the wafer 304 is diced (e.g., sawed, for example with a Mahoh saw, laser cut, scribed and broken, etc.) into individual dies 318, see FIGS. 4 and 5. At 206, the dies 318 are placed into a carrier (e.g., a panel carrier), see FIG. 6. The carrier can include an opened framed container 320 and tape 322 disposed on a bottom of the container 320 that secures the dies 318 to the container 320 during the processing sequence. At 208, a film (e.g., film assist) 324 is applied to the surface 314 of the second end 316 of the pillar contacts 302, see FIG. 7. The film 324 keeps the surface 314 of the pillar contacts 302 clean during application and molding of the dielectric material.

At 210, a dielectric powder is disposed into the frame 320 of the carrier. The dielectric powder surrounds the dies 318 and encloses the active surface 310 of the dies 318. The dielectric powder also surrounds the pillar contacts 302. The surface 314, however, of the pillar contacts 302 remains exposed. At 212, the dielectric powder under goes a dry compression molding process where heat is applied to the powder to transform the powder to a liquefied state. The liquefied dielectric powder undergoes a pressurization process (e.g., compression) and is transformed into a cured dielectric material (hereinafter "dielectric material") 326 thus, forming an array 328, see FIGS. 8 and 9. At 214, the array 328 is removed from the container 320 and the film 324 is removed from the surface 314 of the pillar contacts 302 via an ultra violet light process. At 216, a contact surface 330 of the array 328 is cleaned and polished to remove any residue from the film 324 and to ensure that the surface 314 of each pillar contact 302 is coplanar with the surface of the dielectric material 326, see FIG. 10.

Figure 11:
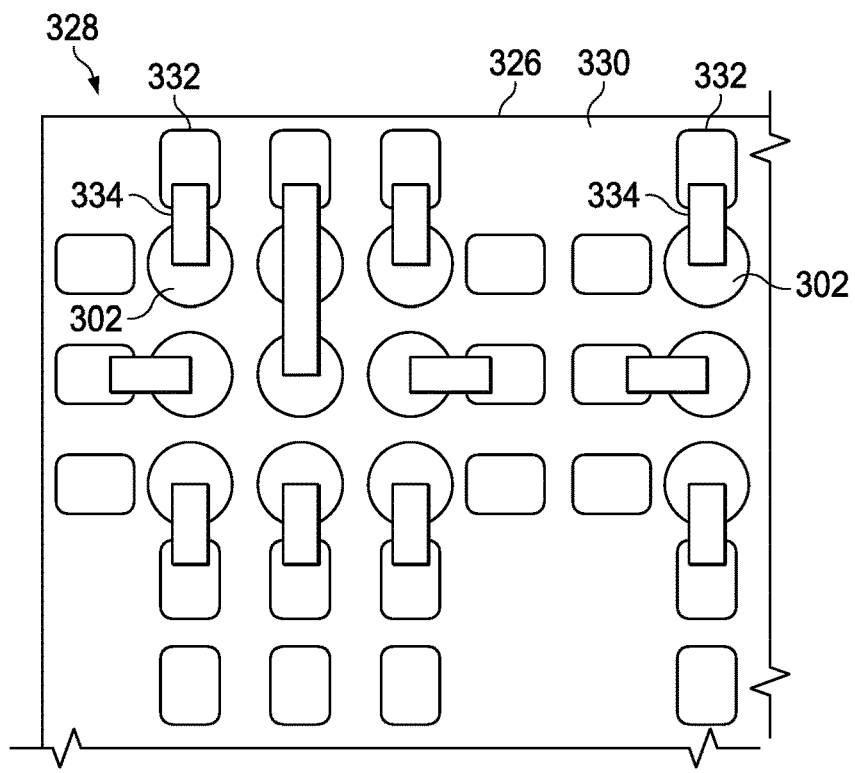
Figure 12:
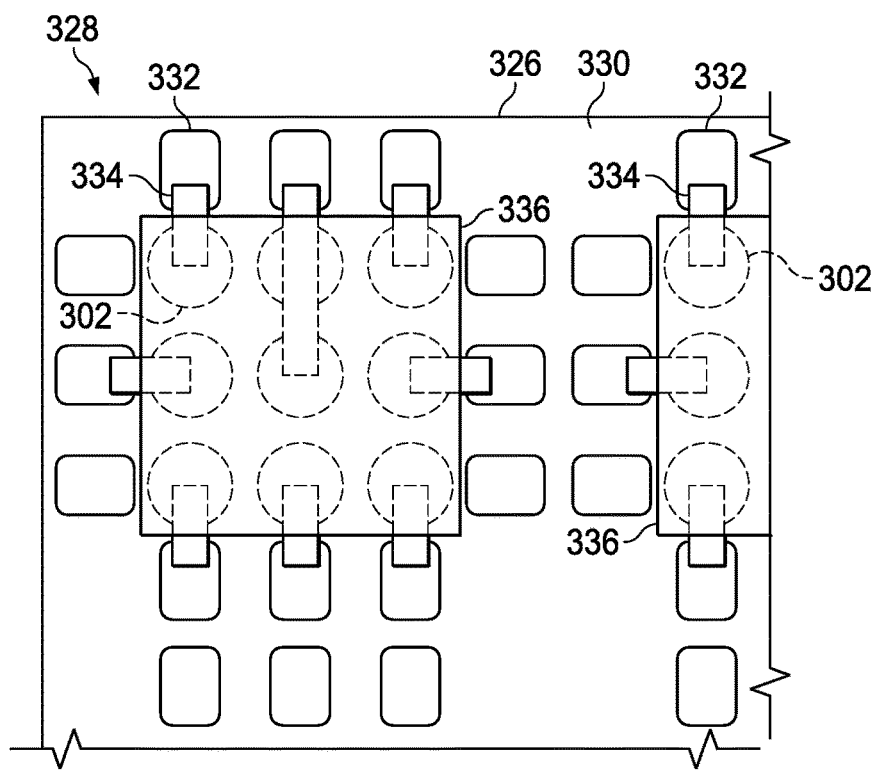
Figure 13:
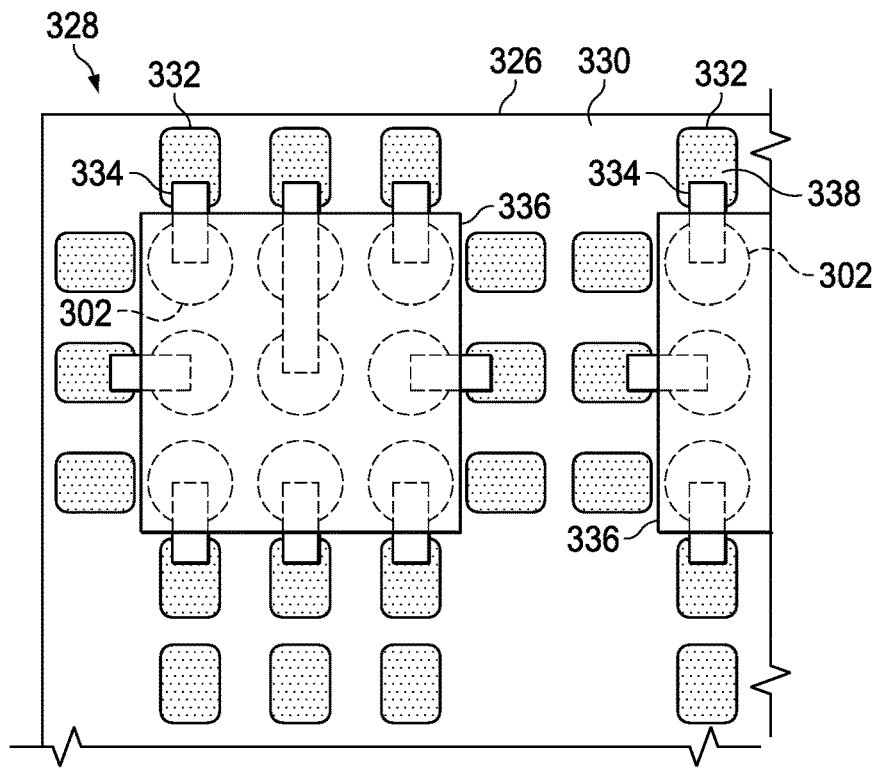

At 218, a print process (e.g., high-speed, 3-D, screen, inkjet, etc.) prints electrical terminations 332 and electrical connector elements 334 on portions of the contact surface 330 of the array 328, see FIG. 11. The print process prints the electrical terminations 332 adjacent to the pillar contacts 302. The electrical terminations 332 provide electrical connections to the PCB. Thus, the electrical terminations 332 eliminate the need for the lead-frame in standard QFN packages. The print process prints the electrical connector elements 334 between the surface 314 of one or more of the pillar contacts 302 and the electrical terminations 332. The electrical connector elements 334 thus, provide an electrical path between the pillar contacts 302 and the electrical terminations 332. Thus, the contact surface 330 of the array 328 (and, hence, the electronic device package illustrated in FIG. 16) is the surface that includes the exposed surface 314 of the pillar contacts 302, the electrical terminations 332, and the electrical connector elements 334, which is the surface that faces the PCB. The printable conductive ink can be a nano metal (e.g., copper, silver, etc.) ink. As mentioned above, the printable conductive ink completes the electrical path from the IC to the PCB. At 220, the print process prints a passivation layer 336 over a portion of the contact surface 330 of the array 328. Specifically, the passivation layer 336 is printed on the surface 314 of the pillar contacts 302 to protect against corrosion, see FIG. 12. The electrical terminations, however, remain exposed for connection to the PCB. At 222, a finishing conductive material (e.g., solder) 338 can be applied to the electrical terminations 116 as a finishing process, see FIG. 13. In some examples, a finishing surface can be disposed (e.g., printed) on the contact surface 330. The finishing surface can be comprised of a compatible material such as, gold, nickel palladium, tin, etc.

Figure 14:
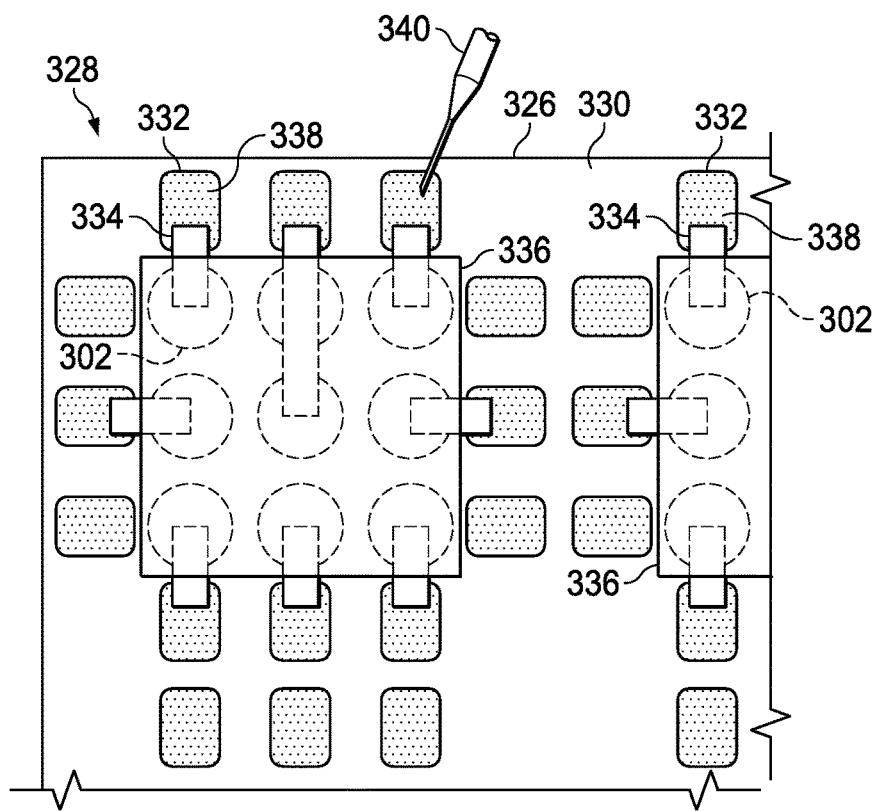
Figure 15:
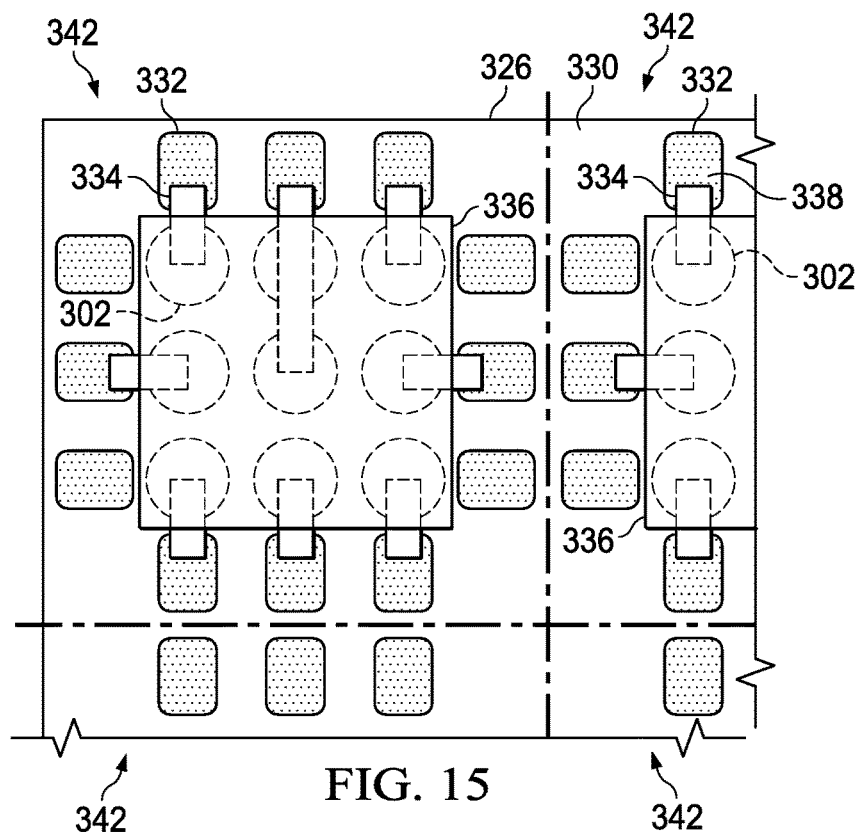

At 224, a strip test, represented by the test probe 340 illustrated in FIG. 14, is performed on the array 328. Strip testing is more cost effective than other methods since strip testing allows for large volume testing. Standard QFN packages do not lend themselves to strip testing as the individual QFN packages are not electrically isolated from each other when formed in the carrier due to contact between adjacent electrical terminations in the lead-frame. The hybrid QFN packages, on the other hand, do not require a lead-frame due to the printing of the electrical terminations 332 with the printable conductive ink described above. Specifically, the electrical terminations 332 in adjacent hybrid QFN packages are isolated from each other when they are printed. Thus, there is no need to separate the hybrid QFN packages prior to testing. Thus, the strip test method can be utilized due to complete isolation between adjacent hybrid QFN packages.

Figure 16:
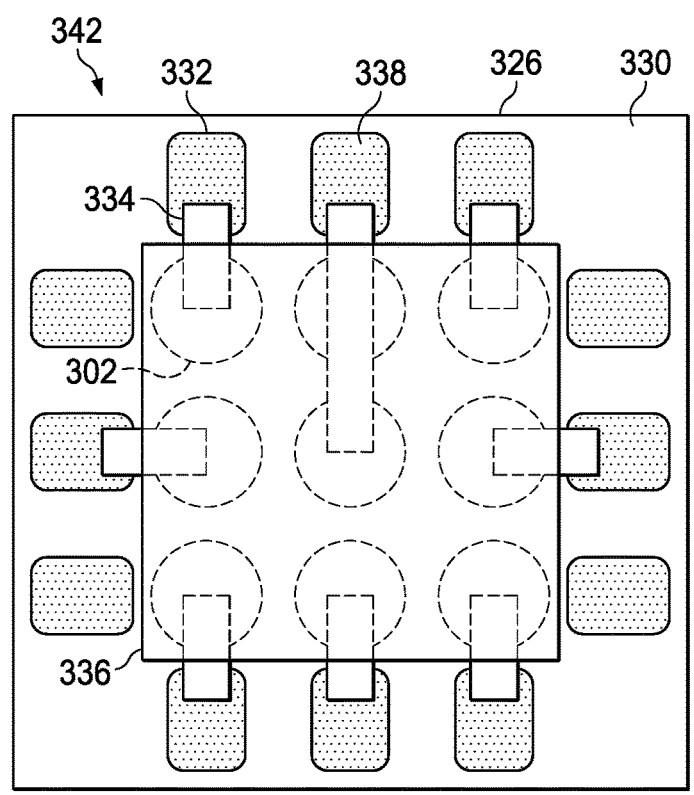

At 226, the array 328 is separated or singulated (illustrated by the dashed line in FIG. 15) into individual electronic device packages (e.g., hybrid QFN package) 342, see FIG. 16. Separating the array 328 into the individual electronic device packages 342 can be performed via a sawing process, etching, a laser process, etc.

As mentioned above, the hybrid QFN package and method has several benefits over the FOWCSP and the standard QFN package. For example, the hybrid QFN package uses a printable conductive ink to print the electrical terminations on the contact surface to connect to the PCB thereby eliminating the need for the lead-frame. Nor does the hybrid QFN package require the connecting wires that electrically connect the components inside the die to the terminations. The elimination of the lead-frame and the connecting wires lead to a reduction in manufacturing costs. In addition, the die in the hybrid QFN package is exposed to ambient air on the non-contact surface of the hybrid QFN package. The exposure facilitates the dissipation of heat from the hybrid QFN package. Standard QFN's, on the other hand, mount the standard QFN to a thermal pad on the PCB, which increases cost and is less effective.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A method comprising:
placing a die in a carrier, the die having pillar contacts electrically coupled to components in the die where the pillar contacts extend beyond an outer surface of the die;
forming a dielectric material in the carrier to cover portions of the die and between the pillar contacts to form an electronic device package;
polishing an exposed surface of the pillar contacts to ensure that the pillar contacts are coplanar with the dielectric material and to form contact surface of the electronic device package having exposed pillar contact ends; and
printing conductive ink on portions of the contact surface of the electronic device package to form electrical connector elements connected to the exposed pillar contact ends.

2. The method of claim 1, wherein printing the conductive ink on portions of the contact surface of the electronic device package includes printing electrical terminations on portions of the dielectric material and printing electrical connections from the exposed pillar contact ends to the electrical terminations.

3. The method of claim 2, further comprising printing a passivation layer over the exposed pillar contact ends.

4. The method of claim 3, further comprising applying a finishing conductive material on the electrical terminations of the dielectric material.

5. The method of claim 1, wherein forming the dielectric material in the carrier to cover portions of the die and between the pillar contacts to form the electronic device package includes depositing a dielectric powder in the carrier to cover portions of the die and between the pillar contacts and applying a compression molding process to liquefy and cure the dielectric powder into the dielectric material.

6. The method of claim 1, further comprising applying an interconnecting conductive material on the exposed pillar contact ends to form mechanical interconnects.

7. The method of claim 1, wherein prior to forming the dielectric material in the carrier to cover portions of the die and between the pillar contacts to form the electronic device package, the method comprises applying a film to the exposed pillar contact ends.

8. The method of claim 7, wherein prior to polishing the exposed surface of the pillar contacts to ensure that the pillar contacts are coplanar with the dielectric material and to form the contact surface of the electronic device package having the exposed pillar contact ends, the method comprises removing the die from the carrier.

9. The method of claim 8, further comprising removing the film from the exposed pillar contact ends.

10. A method comprising:
forming pillar contacts in a wafer, the pillar contacts electrically coupled to components in the wafer, the pillar contacts extending beyond an outer surface of the wafer;
dicing the wafer into dies;
forming a dielectric material to cover portions of the dies and between the pillar contacts to form an array comprised of electronic device packages;
polishing a contact surface of the array, the array having exposed contact ends that are coplanar with the dielectric material; and
printing conductive ink on portions of the contact surface of the array to form electrical terminations and electrical conductor elements, the electrical conductor elements electrically connecting the exposed contact ends to the electrical terminations.

11. The method of claim 10, further comprising:
printing a passivation layer on the exposed contact ends;
applying a finishing conductive material to the electrical terminations; and
separating the array into the electronic device packages.

12. The method of claim 10, wherein forming the dielectric material to cover portions of the dies and between the pillar contacts to form the array comprised of the electronic device packages includes:
placing the dies into a carrier;
adding a dielectric powder to the carrier where the dielectric powder covers portions of the dies and portions of the pillar contacts;
molding the dielectric powder into the dielectric material where the dielectric material is cured to form the array; and
removing the array from the carrier.

13. The method of claim 12, wherein molding the dielectric powder into the cured dielectric material to form the array includes applying a compression molding process to the dielectric powder to liquefy and cure the dielectric powder into the dielectric material.

14. The method of claim 10, wherein prior to forming the dielectric material to cover portions of the dies and between the pillar contacts to form the array comprised of the electronic device packages, the method further comprising applying an interconnecting conductive material on the exposed contact ends of the pillar contacts to form mechanical interconnects.

15. The method of claim 14, further comprising applying a film on the interconnecting conductive material.

* * * * *